(12) United States Patent
Murakami et al.

(10) Patent No.: US 10,817,189 B2
(45) Date of Patent: Oct. 27, 2020

(54) SEMICONDUCTOR MEMORY DEVICE AND OPERATION SETTING METHOD THEREOF

(71) Applicant: Winbond Electronics Corp., Taichung (TW)

(72) Inventors: Hiroki Murakami, Taichung (TW); Makoto Senoo, Taichung (TW)

(73) Assignee: Winbond Electronics Corp., Taichung (TW)

( * ) Notice: Subject to any disclaimer, the term of this patent is extended or adjusted under 35 U.S.C. 154(b) by 176 days.

(21) Appl. No.: 15/840,594

(22) Filed: Dec. 13, 2017

(65) Prior Publication Data
US 2018/0165025 A1    Jun. 14, 2018

(30) Foreign Application Priority Data

Dec. 13, 2016 (JP) ................................. 2016-241216

(51) Int. Cl.
*G06F 3/00* (2006.01)
*G11C 16/00* (2006.01)
(Continued)

(52) U.S. Cl.
CPC .......... *G06F 3/0619* (2013.01); *G06F 3/0634* (2013.01); *G06F 3/0679* (2013.01);
(Continued)

(58) Field of Classification Search
CPC ..... G06F 3/0619; G06F 3/0634; G06F 3/0679
See application file for complete search history.

(56) References Cited

U.S. PATENT DOCUMENTS

| 2001/0003509 A1 | 6/2001 | Hosono et al. |
| 2002/0153917 A1 | 10/2002 | Tanaka et al. |

(Continued)

FOREIGN PATENT DOCUMENTS

| JP | 2001176290 A | 6/2001 |
| JP | 2002318265 A | 10/2002 |
| KR | 10-1576102 B1 | 12/2015 |

OTHER PUBLICATIONS

Korean Intellectual Property Office, Office Action, dated Feb. 8, 2019, 8 pages.

*Primary Examiner* — Reginald G Bragdon
*Assistant Examiner* — Michael L Westbrook
(74) *Attorney, Agent, or Firm* — Muncy, Geissler, Olds & Lowe, P.C.

(57) ABSTRACT

A semiconductor memory device is provided. The semiconductor memory device includes a memory cell array, a read only memory (ROM), a central processing unit, and a random access memory (RAM). The memory cell array stores data related to operating conditions of the semiconductor memory device. The ROM stores data used to control an operation of the semiconductor memory device. The central processing unit controls the operation of the semiconductor memory device according to the data read from the ROM. The central processing unit reads the data related to the operating conditions from the memory cell array in response to a requested operation and then temporarily stores the read data related to the operating conditions in the RAM. The central processing unit further reads the data related to the data related to the operating conditions from the RAM for controlling the operation of the semiconductor memory device.

15 Claims, 8 Drawing Sheets

(51) Int. Cl.

| | | |
|---|---|---|
| *G06F 3/06* | (2006.01) | |
| *G11C 29/02* | (2006.01) | |
| *G11C 16/26* | (2006.01) | |
| *G11C 16/16* | (2006.01) | |
| *G11C 29/46* | (2006.01) | |
| G11C 29/12 | (2006.01) | |
| G11C 29/56 | (2006.01) | |
| G11C 29/04 | (2006.01) | |

(52) U.S. Cl.
CPC .............. *G11C 16/16* (2013.01); *G11C 16/26* (2013.01); *G11C 29/021* (2013.01); *G11C 29/028* (2013.01); *G11C 29/46* (2013.01); *G11C 29/1201* (2013.01); *G11C 2029/0403* (2013.01); *G11C 2029/5602* (2013.01)

(56) References Cited

U.S. PATENT DOCUMENTS

| 2007/0174642 | A1* | 7/2007 | Cornwell | G06F 1/26 |
| | | | | 713/300 |
| 2009/0199049 | A1* | 8/2009 | Yorimitsu | G06F 11/141 |
| | | | | 714/55 |
| 2013/0135007 | A1 | 5/2013 | Surico et al. | |
| 2013/0322149 | A1 | 12/2013 | Ryu et al. | |
| 2014/0173171 | A1* | 6/2014 | Chen | G06F 11/3664 |
| | | | | 711/102 |
| 2015/0177991 | A1* | 6/2015 | Zhang | G11C 5/02 |
| | | | | 711/103 |
| 2016/0239235 | A1* | 8/2016 | Chung | G06F 3/0629 |

* cited by examiner

| optional data | | |
|---|---|---|
| erasing | erasing bias A | erasing verification A |
| | erasing bias B | erasing verification B |
| | erasing bias C | erasing verification C |
| programming | programming bias A | programming verification A |
| | programming bias B | programming verification B |
| | programming bias C | programming verification C |

SEMICONDUCTOR MEMORY DEVICE AND OPERATION SETTING METHOD THEREOF

CROSS REFERENCE TO RELATED APPLICATIONS

This Application claims priority of Japan Patent Application No. JP2016-241216, filed on Dec. 13, 2016, the entirety of which is incorporated by reference herein.

BACKGROUND OF THE INVENTION

Field of the Invention

The invention relates to a semiconductor memory device and an operation setting method thereof, and more particularly to a semiconductor memory device and an operation setting method thereof capable of setting operating conditions in real time.

Description of the Related Art

In a semiconductor memory device, such as a NAND flash memory, as the precision of operation control is improved, there are a growing number of operations at the time of reading, programming, and erasing. Since it is difficult to decide what the optimal operating conditions are prior to shipping, a semiconductor chip is usually equipped with several options, so that optimal operating conditions can be selected from among multiple operating conditions.

For example, U.S. Patent Publication No. 2013/0322149 A1 discloses a memory device having a fuse device and a fuse control circuit. The fuse device includes a first fuse cell sub-array and a second fuse cell sub-array. The first fuse cell sub-array is used to store the first data related to the operation of the fuse control circuit. The second fuse sub-array is used for storing the second data related to the operation of the memory device. The fuse control circuit is configured to read the first and second data from the first and second fuse cell sub-arrays, respectively.

Figure 1:
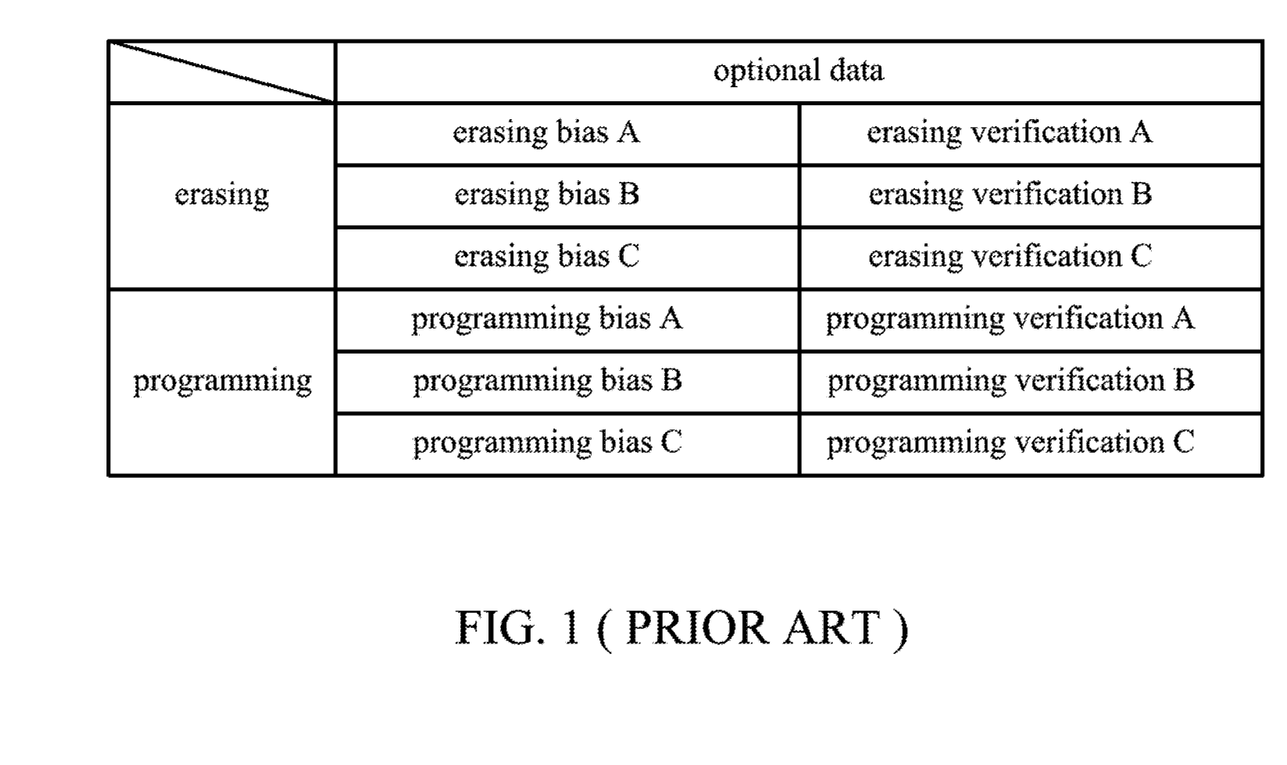
FIG. 1 is a schematic view showing optional data stored in a conventional NAND flash memory.

In a conventional semiconductor memory device, in order to be able to perform all the operations related to the memory operation, the data corresponding to all the operations are stored in the fuse array or the like, and the preferred data is selected from data of all the operations through an evaluation test which is performed before shipping. FIG. 1 shows data of a plurality of operations (hereinafter referred to as optional data) that can be selected in a NAND flash memory. In the example shown in FIG. 1, there are three optional data (A, B and C) for determining each condition of erasing and programming operations. Each optional data for erasing bias (hereinafter referred to as erasing bias A, erasing bias B, and erasing bias C) can be used to determine the initial pulse height and the step amplitude of the erasing pulse applied to the P-type well region of a selected block. Each optional data for erasing verification (hereinafter referred to as erasing verification A, erasing verification B, and erasing verification C) can be used to determine the voltage applied to word lines and the conditions of the pass/fail test, and so on. Each optional data for programming bias (hereinafter referred to as programming bias A, programming bias B, and programming bias C) can be used to determine the initial pulse height and the step amplitude of the programming pulse applied to the selected word line. Each optional data for programming verification (hereinafter referred to as programming verification A, programming verification B, and programming verification C) can be used to determine the voltage applied to word lines and the conditions of the pass/fail test, and so on. The method of selecting the optimal one from these optional data is executed by, for example, programming a fuse ROM (Read Only Memory) or the like at the time of the evaluation test before the product is shipped. After the product is shipped, the semiconductor memory device determines the operating conditions and controls its operation based on the selected optimal optional data.

However, the conventional semiconductor memory device described above suffers from the problems described below. For example, the fuse array shown in U.S. Patent Publication No. 2013/0322149 A1 is configured to be a readable/writable memory area in the same manner as a memory cell array, and the data stored therein is earliest read in the power-up sequence. Since the operating conditions are determined based on the optional data read from the fuse array, the reliability of the data of the fuse array is required. One of the solutions is to use a majority decision to determine the data stored in the fuse array. In other words, 1-bit readout data is "0" or "1" according to the majority decision applied on "0" or "1" in n-bit readout data. For example, when n is equal to 16, if the number of bits with a specific value is more than 8 (half of 16), the specific value determines the value of the readout data. Although such a majority decision method can guarantee reliability of the data, from another perspective, it also causes the problem of increasing the amount of actually used data.

In some storage media, there are other methods of storing optional data instead of using the fuse array. In cases where a semiconductor memory device is controlled by an on-chip microcomputer (including CPU, ROM, RAM) rather than a state machine, it is possible to store not only program data or code data for controlling the operation, but also to store the optional data in the ROM for achieving execution of all the operations. The amount of optional data becomes larger as the operation of the semiconductor memory device becomes more complicated and precise, thereby a problem where high-capacity ROM is required is suffered. On the other hand, restricting the capacity for the optional data may reduce the flexibility of the semiconductor memory device, which may make it impossible to operate under the optimal operating conditions. Furthermore, if the semiconductor memory device cannot be operated under operating conditions commensurate with the test results, the semiconductor memory device would have to be a defective product, resulting in a lower yield.

BRIEF SUMMARY OF THE INVENTION

It is an object of the present invention to provide a semiconductor memory device which is capable of solving such problems with conventional semiconductor memory devices, and which furthermore is capable of minimizing the resources of a ROM used for storing data related to operating conditions while maintaining the flexibility of operations.

An exemplary embodiment of a semiconductor memory device is provided. The semiconductor memory device comprises a memory cell array, a read only memory (ROM), a central processing unit, and a random access memory (RAM). The memory cell array stores data related to operating conditions of the semiconductor memory device. The ROM stores data used to control an operation of the semiconductor memory device. The central processing unit controls the operation of the semiconductor memory device according to the data read from the ROM. The central processing unit reads the data related to the operating conditions from the memory cell array in response to a requested operation and then temporarily stores the read data related to the operating conditions in the RAM. The central processing unit further reads the data related to the data related to the operating conditions from the RAM for controlling the operation of the semiconductor memory device.

In a preferred embodiment, the data related to the operating conditions includes at least one of data related to conditions of a programming operation and data related to conditions of an erasing operation. In a preferred embodiment, the data related to the operating conditions includes data related to a voltage which is applied to the memory cell array during the programming operation and data related to a voltage which is applied to the memory cell array during a programming verification. In a preferred embodiment, the data related to the operating conditions includes data related to a voltage which is applied to the memory cell array during the erasing operation and data related to a voltage which is applied to the memory cell array during an erasing verification. In a preferred embodiment, the central processing unit controls the voltages applied to the memory cell array according to the data related to the operating conditions. In a preferred embodiment, the memory cell array comprises a plurality of NAND strings. In a preferred embodiment, the ROM stores data for optional-data reading, and the data related to the operating conditions is read from the memory cell array according to the data for optional-data reading. The central processing unit reads the data for optional-data reading from the ROM in response to a requested operation. In a preferred embodiment, the semiconductor memory device further comprises an external terminal which transmits and receives data between the semiconductor memory device and the outside. During a test operation, the external terminal receives the data related to the operating conditions, and the central processing unit receives the data related to the operating conditions, which is provided from the external terminal, and writes the received data related to the operating conditions to the RAM. In a preferred embodiment, the data related to the operating conditions is optional data used to determine preferred operating conditions of the semiconductor memory device. In a preferred embodiment, the ROM is a photomask ROM.

An exemplary embodiment of an operation setting method for a semiconductor memory device is provided. The semiconductor memory device comprises a memory cell array, a read only memory (ROM) storing data used to control an operation of the semiconductor memory device flash memory, and a central processing unit controlling the operation of the semiconductor memory device according to the data read from the ROM. The operation setting method comprises the following of providing random access memory (RAM); storing data related to operating conditions in the memory cell array; reading the data related to the operating conditions from the memory cell array and temporarily storing the read data related to the operating conditions in the RAM; and controlling the central processing unit to operate according to the data related to the operating conditions which is read from the RAM. In a preferred embodiment, the operation setting method further comprises the step of performing a test operation on the semiconductor memory device before shipping. A result of the test operation determines the data related to the operating condition. In a preferred embodiment, the operation setting method further comprises the step of storing data for optional-data reading in the ROM. The data related to the operating conditions is stored in the memory cell array according to the data for optional-data reading and read from the memory cell array according to the data for optional-data reading.

According to the present invention, the data related to the operating conditions of the semiconductor memory device is stored in the memory cell array, and the data related to the operating conditions is read from the memory cell array according to the requested operation, so that it is possible to reduce the resource occupied by the data related to the operating conditions in the ROM. Second, since the data related to the preferred operating conditions is stored in the memory cell array or the data related to the operating conditions in the memory cell array can be changed, the flexibility of the operating conditions of the semiconductor memory device can be maintained.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

An embodiment of the present invention will be described in detail herein with reference to the drawings. The semiconductor memory device of the present invention is not limited to a specific semiconductor memory device, but it is suitable for a NAND flash memory or a semiconductor device embedded in a NAND flash memory.

Figure 2:
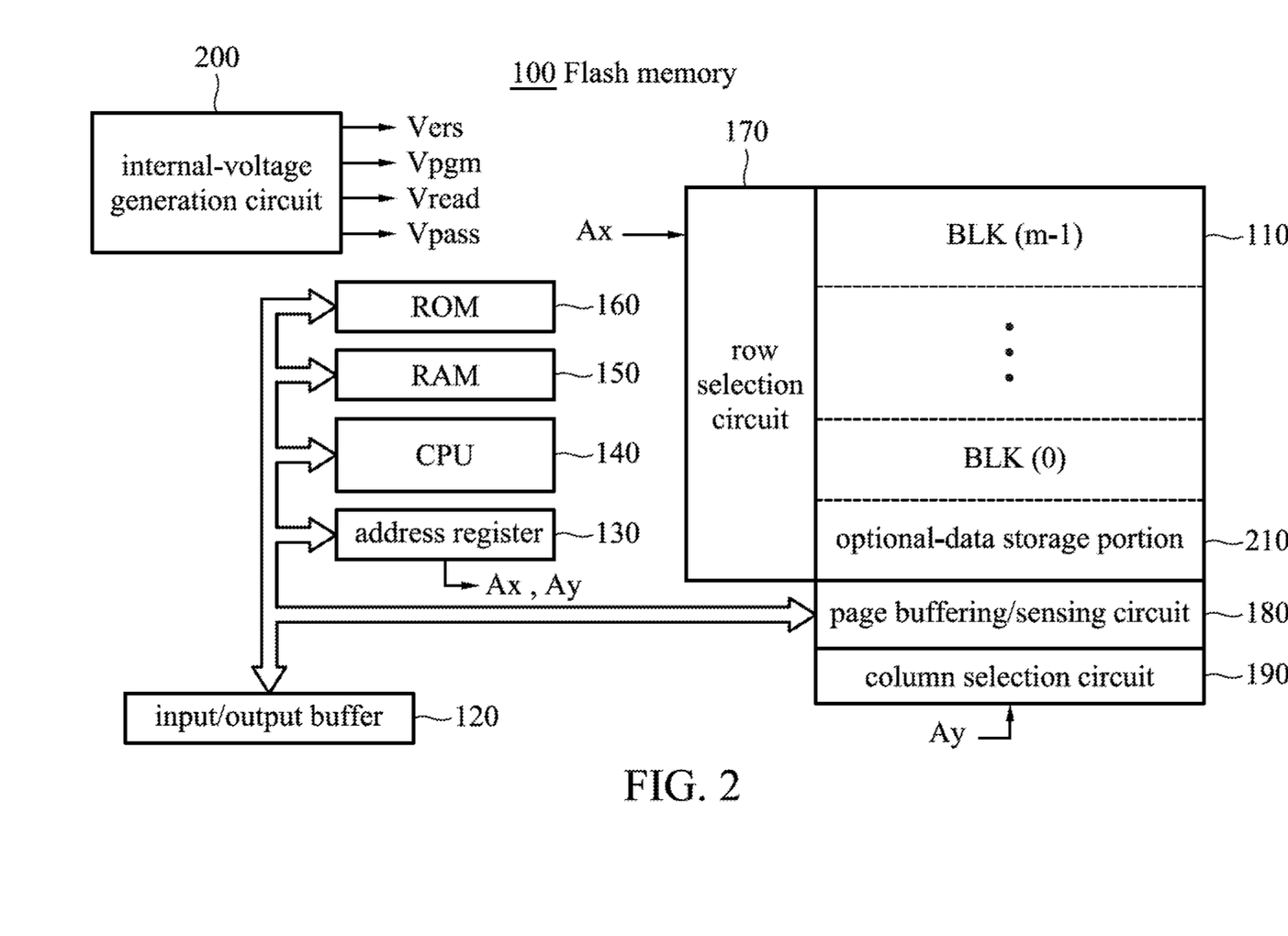
FIG. 2 is a block diagram showing a structure of a NAND flash memory according to an exemplary embodiment.

FIG. 2 is a block diagram showing a structure of a NAND flash memory according to an embodiment of the present invention. The flash memory 100 comprises a memory cell array 110, an input/output buffer 120, an address register 130, a central processing unit (CPU) 140, a random access memory (RAM) 150, a ROM 160, a row selection circuit 170, a page buffering/sensing circuit 180, a column selection circuit 190, and an internal-voltage generation circuit 200. The memory cell array 110 comprises a plurality of memory cells arranged in a matrix. The input/output buffer 120, which is connected to an external terminal, is used to keep the input/output data. The address register 130 receives the address data from the input/output buffer 120. The row selection circuit 170 receives the row address information Ax from the address register 130 and performs operations, such as selection of blocks and selection of word lines, according to the decoding result of the row address information Ax. The page buffering/sensing circuit 180 is for keeping the data read from the page selected by the row selection circuit 170 and holding the data to be written to the selected page. The column selection circuit 190 receives the column address information Ay from the address register 130 and selects the data in the page buffering/sensing circuit 180 according to the decoding result of the column address information Ay. The internal-voltage generation circuit 200 generates various voltages (a programming voltage Vpgm, a pass voltage Vpass, a reading pass voltage Vread, an erasing voltage Vers, etc.) required for operations such as data programming, reading, and erasing, and the like.

The memory cell array 110 comprises m memory blocks BLK (0), BLK (1), . . . , BLK (m−1) arranged in the column direction. Each memory block comprises a plurality of NAND strings, and each NAND string comprises a plurality of memory cells connected in series. The memory cell array 110 further comprises an optional-data storage portion 210 for storing optional data related to the memory operating conditions. Like the other blocks, the optional-data storage portion 210 includes NAND strings. Therefore, through the row selection circuit 170, the page buffering/sensing circuit 180, the column selection circuit 190, data can be read from the selected page of the optional-data storage portion 210, or the selected page can be programmed further, or a selected block can be erased.

The ROM 160 is used to permanently store the programs and data used to control the operations (reading, programming, erasing, test, etc.) of the flash memory 100. The ROM 160 is not limited to a specific type, and may be formed of, for example, a mask ROM, a fuse ROM, or a one-time programmable ROM. The RAM 150 is used to temporarily store the data loaded from the ROM 160, or to temporarily store the data read from the optional-data storage portion 210 as described later, further or to temporarily store the data provided by an external terminal or the input/output buffer 120. The RAM 150 is not limited to a specific type, and may be formed of, for example, an SRAM or a DRAM with a higher reading/writing speed.

The CPU 140 controls the operations of the flash memory 100 based on the programs and data read from the RAM 150 and the ROM 160. The CPU 140 can control the operations of the flash memory 100 in response to an instruction input from the input/output buffer 120 and an external control signal.

An exemplary embodiment of the operations of the flash memory 100 is provided hereafter. In the reading operation of the flash memory 100, the data of the selected page is read to the page buffering/sensing circuit 180 through applying a certain positive voltage to the bit line, applying a certain voltage (for example, 0V) to the selected page, and applying the pass voltage Vpass (for example, 4.5V) to the non-selected pages. In the programming operation, a selected page may be programmed through applying the programming voltage Vpgm with a high level (for example, 15~25V) to the selected page, applying an intermediate potential (for example, 10V) to the non-selected pages, and holding the programming data by the page buffering/sensing circuit 180. In the programming verification operation, the selected page is read for verification through applying a programming verification voltage to the selected page. A better approach for the programming verification operation is to apply a programming pulse using the incremental step pulse program (ISPP). In the erasing operation, data may be erased by taking a block as a unit through applying 0V to the selected word lines in the block and applying a high voltage (such as 20V) to the P-type well region. In the erasing verification operation, the selected page is read for verification through applying an erasing verification voltage to the selected page. A better approach for the erasing verification operation is to apply an erasing pulse using the incremental step pulse erase (ISPE).

Figure 3:
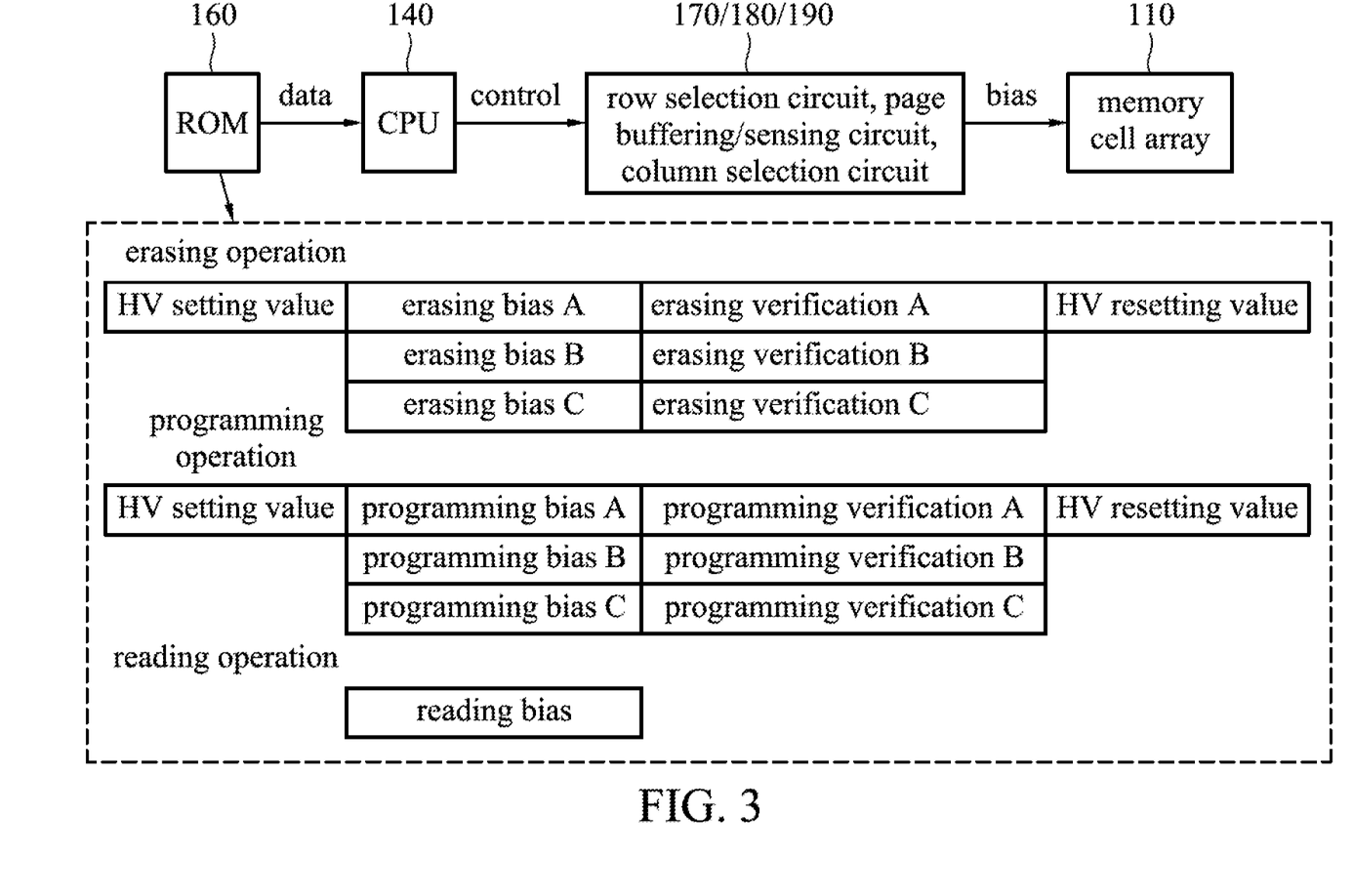
FIG. 3 is a schematic view showing an operation of storing all optional data in a ROM.

In the current solution, as shown in FIG. 3, all the data related to the operating conditions of the flash memory are stored in the ROM 160. For example, a high voltage (HV) setting value, erasing biases A, B, and C, erasing verifications A, B, and C, and an HV resetting value are stored in the ROM 160 as the data related to the conditions of erasing operation. An HV setting value, programming biases A, B, and C, programming verifications A, B, and C, and an HV resetting value are stored in the ROM 160 as the data related to the conditions of programming operation. Here, the HV setting values are the data related to the operating conditions of the charge pump circuit and the like of the internal voltage generation circuit 200, and include, for example, the data that determine the operating sequence and the like of the charge pump circuit. The HV resetting values are the data related to the operating conditions that are used when the high voltage in the charge pump circuit is reduced.

Each of the erasing biases A, B, and C is optional data containing the data related to the pulse height value, the step amplitude, and the application time of the erasing pulse applied to the P-type well region of the selected block, and may further contain other data related to the erasing operation and the data related to the order of the erasing operation (operation sequence, etc.). For example, according to the erasing bias A, the initial value of the pulse height is 19V, the step amplitude is 1V; according to the erasing bias B, the initial value of the pulse height is 20V, and the step amplitude is 0.8V. Each of the erasing verifications A, B, and C is optional data containing the data related to the voltage applied to the word line, the voltage application time, and may further contain other data related to the erasing verification and the data related to the order of the erasing verification operation (operation sequence, etc.) which are used when the erased selected block is verified. For example, according to the erasing verification A, the voltage applied to the word line is 0V; according to the erasing verification B, the voltage applied to the word line is 0.1V.

Each of the programming biases A, B, C is optional data containing the data related to the pulse height value, the step amplitude and the application time of the programming pulse applied to the word lines of the selected page, and may further contain other data related to the programming operation and the data related to the order of the programming operation (operation sequence, etc.). For example, according to the programming bias A, the initial value of the pulse height is 15V, the step amplitude is 1V; according to the programming bias B, the initial value of the pulse height is 16V, and the step amplitude is 0.8V. Each of the programming verifications A, B, and C is optional data containing the data related to the voltage applied to the word lines of the selected page, the voltage application time, and may further contain the other data related to the programming verification and the data related to the order of the programming verification operation (operation sequence, etc.). A selection code for selecting the optimal data from all of these optional data is programmed by trimming the fuse ROM or the like before shipping based on the evaluation test, for example.

Figure 4:
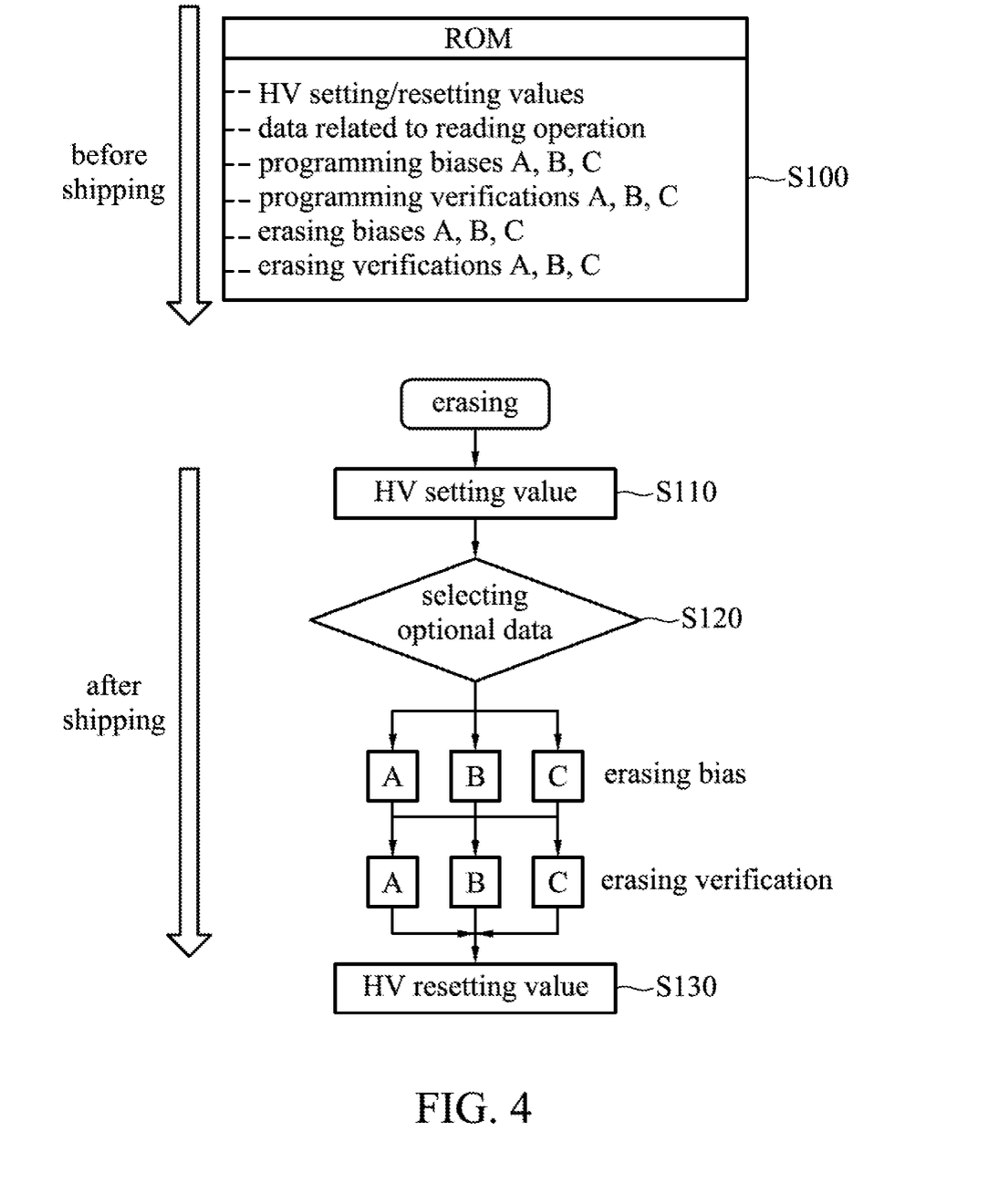
FIG. 4 is a schematic view showing optional data stored before shipping and an operation controlled according to the optional data after shipping.

FIG. 4 is a schematic view showing the data stored before the shipment of the product and the operation controlled according to the data after the shipment of the product. Before the shipment of the product, the ROM 160 stores all the data including HV setting/resetting values, the data related to the reading operation, the programming biases A, B, and C, the programming verifications A, B, and C, erasing biases A, B, and C, the erasing verifications A, B, and C, etc. (step S100). When the ROM 160 is a photomask ROM, data is burned onto the wafer using a photomask during the manufacturing process of the chip.

Since transistors, wirings and the like constituting the memory cells, the peripheral circuits, and the like are prone to be affected by offset values and variations in the manufacturing process, the optimum operating conditions of the flash memory may differ from chip to chip in some cases. Therefore, it is difficult to determine the optimal operating conditions of the chip from a large number of selectable optional data which are previously stored in the ROM 160 prior to the manufacturing. In a typical solution, the preferred optional data for the operating conditions, such as the programming bias, the programming verification, the erasing bias, and the erasing verification, can be determined by operating the flash memory 100 in the evaluation test after the manufacturing. Then, the selection codes used to select the preferred optional data are programmed by trimming of the fuse ROM or the like.

After the product is shipped, the CPU 140 performs operations, such as reading, erasing, programming, etc. according to an instruction input from the outside. The CPU 140 executes programs in the ROM 160 which correspond to the requested operation. In addition, as shown in FIG. 3, the ROM 160 contains all the data related to the operating conditions of the flash memory, and the preferred optional data can be selected therefrom according to the selection codes and read by the CPU 140. The CPU 140 then controls internal-voltage generation circuit 200, the row selection circuit 170, the page buffering/sensing circuit 180, and the column selection circuit 190 according to the data related to the requested operation, and control the bias and the verification voltage applied to the P-type well region of the memory cell array 110 according to the preferred optional data. For example, as shown in FIG. 4, when the erasing operation is performed, the CPU 140 determines the operating conditions of the internal-voltage generation circuit 200 by using the data related to the HV setting value read from the ROM 160 and controls the generation of a high voltage (S110). In addition, the preferred optional data is selected from all the optional data in the ROM 160 by using the selection codes, that is, one of the erasing biases A, B, and C is selected, and one of the erasing verification A, B, and C is selected (S120). The erasing operation is performed according to the combination of the preferred optional data. When the erasing operation is completed, the CPU 140 resets the charge pump circuit by using the data related to the HV resetting value (S130).

In the conventional solution, since the ROM 160 needs to store all the optional data, the resources allocated to the optional data in the ROM 160 is increased. In addition, in cases where all the optional data is stored by using a mask ROM, the operation of changing the optional data becomes very complicated. In the embodiment, the optional-data storage portion 210 is provided in the memory cell array 110 for storing optional data. During the operation, the optional data is instantly loaded into the RAM 150 from the optional-data storage portion 210. Thus, the operating conditions of the CPU 140 can be controlled by using the optional data loaded into the RAM.

Figure 5A:
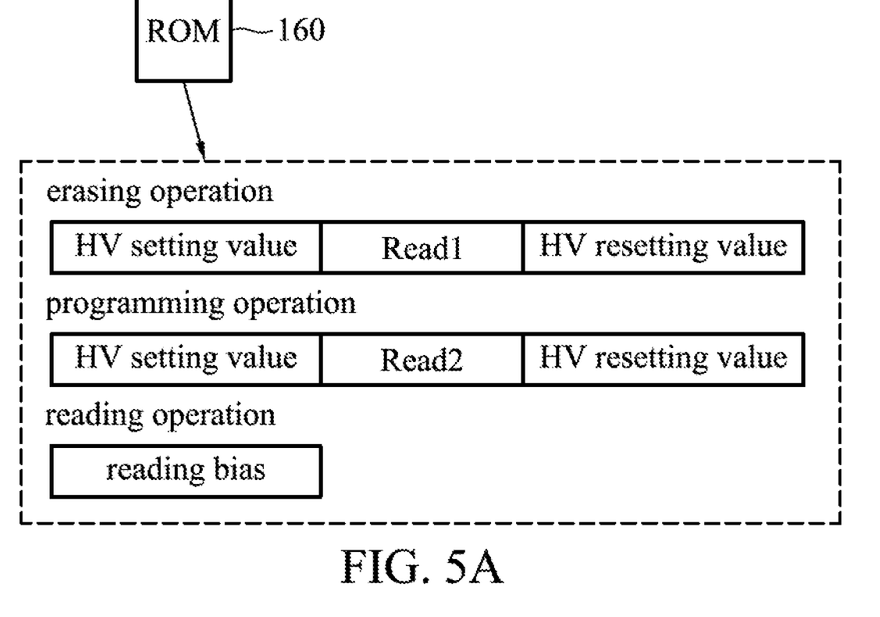
FIG. 5(A) is a schematic view showing optional data stored in a ROM according to an exemplary embodiment.

FIG. 5 is a schematic view showing the storage of the optional data according to an exemplary embodiment. As shown in FIG. 5(A), compared with the large number of optional data stored in the ROM 160 of FIG. 3, the ROM 160 of the embodiment stores only the optional data for the minimum necessary. Specifically, the data stored in the ROM 160 of the embodiment is related to an erasing operation, a programming operation, and a reading operation. The optional data related to the erasing operation includes the HV setting value, the HV resetting value, and further includes the data for optional-data reading Read1. The data for optional-data reading Read1 contains a read command and an address. The preferred optional data for the erasing operation is read from the optional-data storage portion 210 according to the data for optional-data reading Read1 when the CPU 140 performs the erasing operation.

The optional data related to the programming operation includes the HV setting value, the HV resetting value, and further includes the data for optional-data reading Read2. The data for optional-data reading Read2 contains a read command and an address. The preferred optional data for the programming operation is read from the optional-data storage portion 210 according to the data for optional-data reading Read2 when the CPU 140 performs the programming operation. In addition, similar to the example of FIG. 3, the optional data related to the reading operation is used for the reading bias. In the embodiment, the ROM 160 does not have other optional data in addition to the shown optional data.

Figure 5B:
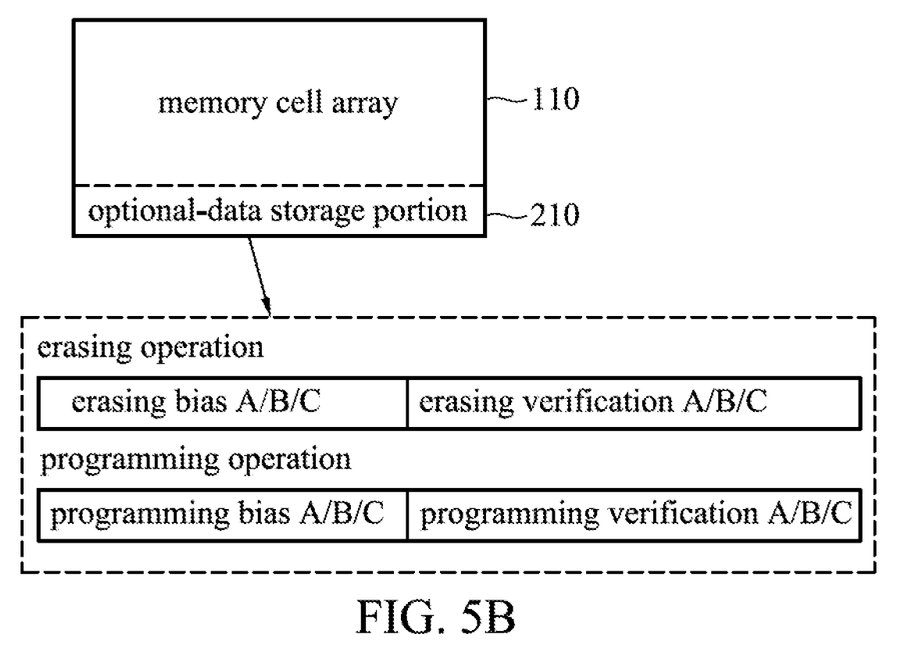
FIG. 5(B) is a schematic view showing optional data stored in an optional-data storage portion according to an exemplary embodiment.

On the other hand, the preferred optional data is programmed to the optional-data storage portion 210 of the memory cell array 110. Specifically, as shown in FIG. 5(B), the preferred optional data related to the erasing operation is stored in the first storage area of the optional-data storage portion 210. For example, any one of the erasing biases A, B, and C and any one of the erasing verifications A, B, and C may be stored in the first storage area of the optional-data storage portion 210. According to the data for optional-data reading Read1 stored in the ROM 160, the CPU 140 reads the preferred optional data stored in the first storage area and temporarily stores it in the RAM 150. Moreover, the preferred optional data related to the programming operation is stored in the second storage area of the optional-data storage portion 210. For example, any one of the programming biases A, B, and C and any one of the programming verifications A, B, and C may be stored in the second storage area of the optional-data storage portion 210. According to the data for optional-data reading Read2 stored in the ROM 160, the CPU 140 reads the preferred optional data stored in the second storage area and temporarily stores it in the RAM 150.

Figure 6:
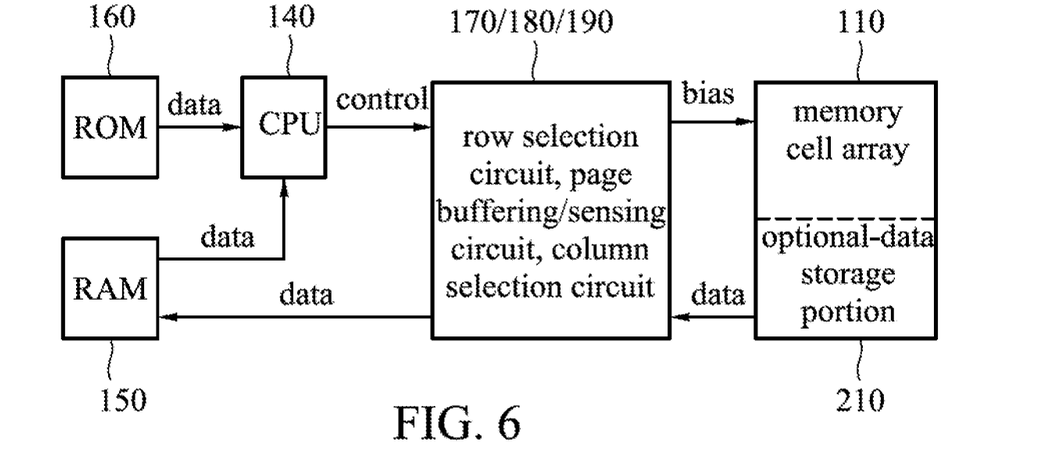
FIG. 6 is a schematic view showing that optional data are loaded into a RAM according to an exemplary embodiment.
Figure 7:
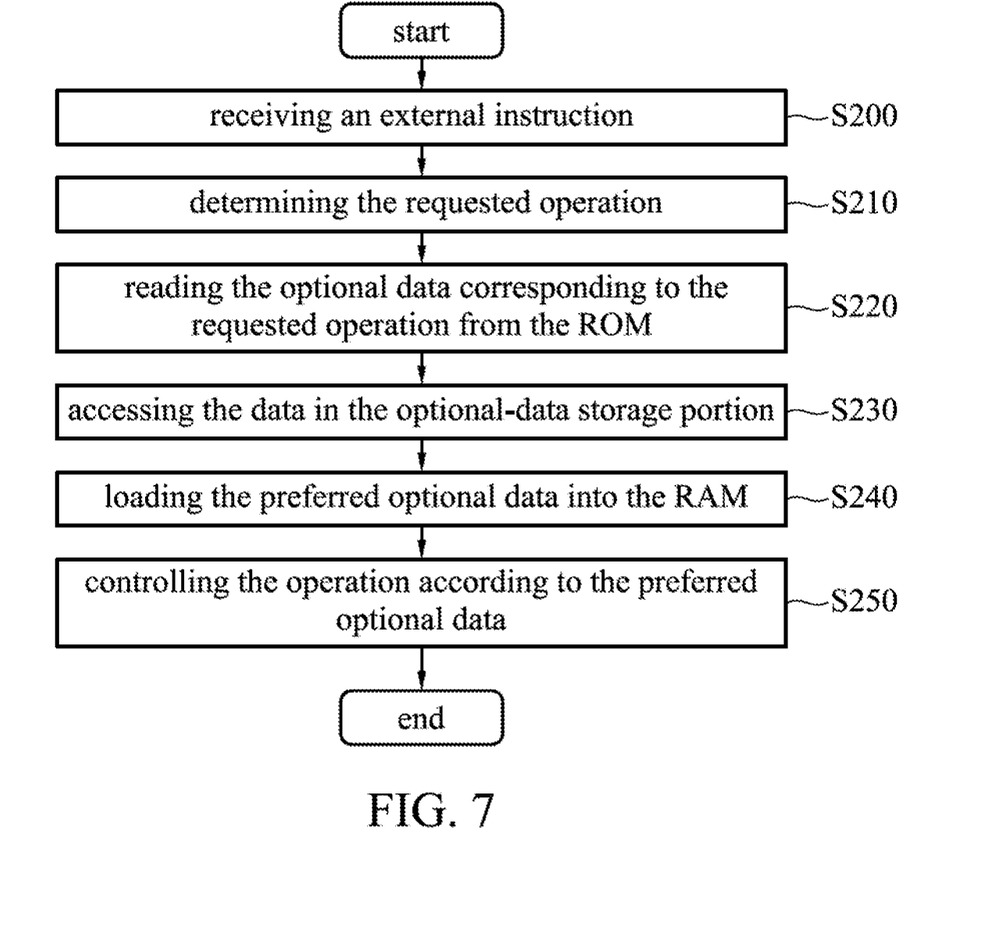
FIG. 7 is a flow chart of reading the optional data by CPU for controlling an operation according to an exemplary embodiment.

FIG. 6 is a schematic view showing the data flow induced when the preferred optional data read from the optional-data storage portion 210 is loaded into the RAM. FIG. 7 is a flow chart of reading the optional data by the CPU for controlling a corresponded operation. As shown in FIG. 7, the CPU 140 receives an instruction from the outside (S200) and determines the requested operation according to the instruction (S210). Next, the CPU 140 reads the optional data corresponding to the requested operation from the ROM 160 (S220). For example, when receiving an erasing instruction, the CPU 140 reads the optional data related to the erasing operation from the ROM 160. In the embodiment of FIG. 5, the CPU 140 reads the HV setting value, the data for optional-data reading Read1, and the HV resetting value from the ROM 160. The CPU 140 accesses the data in the optional-data storage portion 210 through the row selection circuit 170, the page buffering/sensing circuit 180, and the column selection circuit 190 in the same manner as the reading operation of the general memory cell array (S230) and reads the preferred optional data related to the erasing operation from the optional-data storage portion 210 and further loads the read data into the RAM 150 (S240). The CPU 140 can control the internal-voltage generation circuit 200 to generate a high voltage according to the HV setting value read from the ROM 160 while reading the preferred optional data. Next, the CPU 140 applies an erasing bias to the P-type well region according to the preferred optional data held in the RAM 150 and then performs the erasing verification on the selected block (S250). When the erasing operation is ended, the CPU 140 controls the high-voltage discharge of the internal-voltage generation circuit 200 according to the HV resetting value.

Similarly, when receiving a programming instruction from the outside, the CPU 140 reads the optional data related to the programming operation from the ROM 160 and controls the related operations according to the optional data. The CPU 140 controls the internal-voltage generation circuit 200 to generate a high voltage according to the HV setting value. The CPU 140 reads the preferred optional data related to the programming operation from the optional-data storage portion 210 according to the data for optional-data reading Read2 through the row selection circuit 170 and the column selection circuit 190 and loads the preferred optional data into the RAM 150. Next, the CPU 140 applies a programming bias to the selected word line according to the preferred optional data held in the RAM 150 and then performs the programming verification on the selected page. When the programming operation is ended, the CPU 140 controls the high-voltage discharge of the internal-voltage generation circuit 200 according to the HV resetting value.

In cases where a read command is received, since the optional-data storage portion 210 of the embodiment does not store the preferred optional data related to the reading operation, the CPU 140 performs the reading operation on the selected page according to the reading bias stored in the ROM 160.

Figure 8:
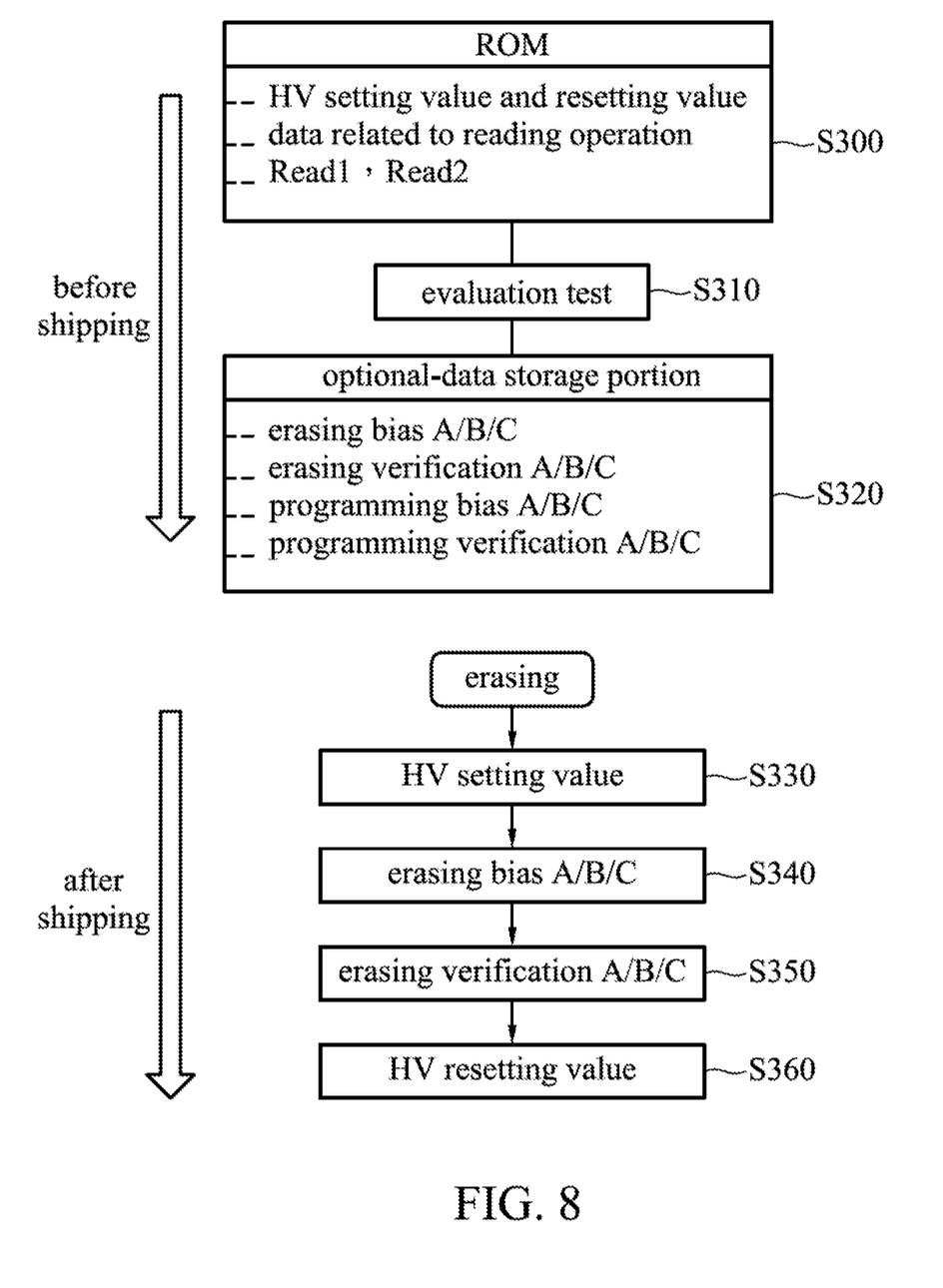
FIG. 8 is a schematic view showing optional data stored before shipping and an operation controlled according to the optional data after shipping, according to an exemplary embodiment.

FIG. 8 is a schematic view showing the optional data stored before the shipment of the product and further showing an operation controlled according to the optional data after the shipment of the product, according to the embodiment. In the embodiment, the ROM 160 is composed of a photomask ROM, and the optional data for the minimum necessary and the data for optional-data reading Read1 and Read2 as shown in FIG. 5 are recorded to the silicon wafer (S300) in the manufacturing process of the flash memory.

After the manufacturing, an evaluation test of the flash memory 100 is performed at wafer level or chip level (S310). Based on the test results, the preferred optional data is determined, and the preferred optional data is programmed to the optional-data storage portion 210 (S320). This programming operation is performed in the same manner as the other programming operations of the memory cell arrays 110. After the programming operation for the preferred optional data finishes, the flash memory 100 can be shipped.

After the shipment, the flash memory 100 loads the preferred optional data into the RAM 150 from the optional-data storage portion 210 in real time according to the requested operation, and the CPU 140 controls the operations by using the preferred optional data loaded into the RAM 150. Steps S330 to S360 shown in FIG. 8 are exemplary steps performed in the erasing operation. When receiving an external erasing command, the CPU 140 reads the optional data related to the erasing operation from the ROM 160, controls the generation of the high voltage by using the HV setting value contained therein (S330), reads the preferred optional data from the optional-data storage portion 210 according to the data for optional-data reading Read1, and temporarily holds the preferred optional data in the RAM 150. For example, the CPU 140 applies an erasing pulse which is generated according to the preferred optional data for the erasing bias (for example, one of the erasing biases A, B, and C) to the P-type well region (S340). Next, the CPU 140 performs the erasing verification on all the pages of the selected block according to the preferred optional data for the erasing verification (for example, one of the erasing verifications A, B, and C). When the erasing operation is completed, the CPU 140 resets the internal-voltage generation circuit 200 according to the HV reset value (S360).

In the above embodiments, the preferred optional data is stored in the optional-data storage portion 210. When the flash memory is operating, the optional data is instantly read from the optional-data storage portion 210 to the RAM 150, so that the resources allocated to the optional data in the ROM 160 can be reduced.

In the above embodiments, the preferred optional data is programmed to the optional-data storage portion 210 before the product is shipped, but it is not intended to limit the present invention. In other embodiments, the preferred optional data may also be programmed to the optional data storage unit 210 after the product is shipped. In this case, the preferred optional data is provided from a host device to the flash memory 100 and then programmed to the optional-data storage portion 210. Accordingly, it is possible to change the preferred optional data for the flash memory even after the product is shipped. Therefore, even when the operating conditions of the flash memory needs to be changed in response the long-term use and the frequency of use, etc., it is possible to respond flexibly. Particularly in cases where the ROM 160 is a photomask ROM, if the preferred optional data is stored in the photomask ROM as per the prior art, the photomask needs to be changed later in order to change the preferred optional data, which results in a greater burden in time and cost. However, as shown in the embodiments, the preferred optional data is rewritten to the memory cell array (for example, a NAND string), so that the operation becomes easy.

In the above embodiments, although the optional data related to the erasing bias, the erasing verification, the programming bias, and the programming verification is taken as an example of the optional data stored in the optional-data storage portion 210, the optional data may be other optional data capable determining the option conditions of the flash memory 100. It should be noted that the above embodiments do not intend to limit the invention to the specific type of the optional data stored in the ROM 160 and the specific type of the optional data stored in the optional data memory 210, and the types are freely settable.

Next, an exemplary embodiment of the method for programming the optional data for the flash memory before the shipment of the product will be described. In the stage of manufacturing a chip, no data is stored in the optional-data memory 210 and the RAM 150 (the data is empty). Therefore, in this state, it is impossible to determine the operating conditions of the flash memory 100 according to the data of the RAM 150, so that the preferred optional data cannot be determined in the evaluation test.

Figure 9:
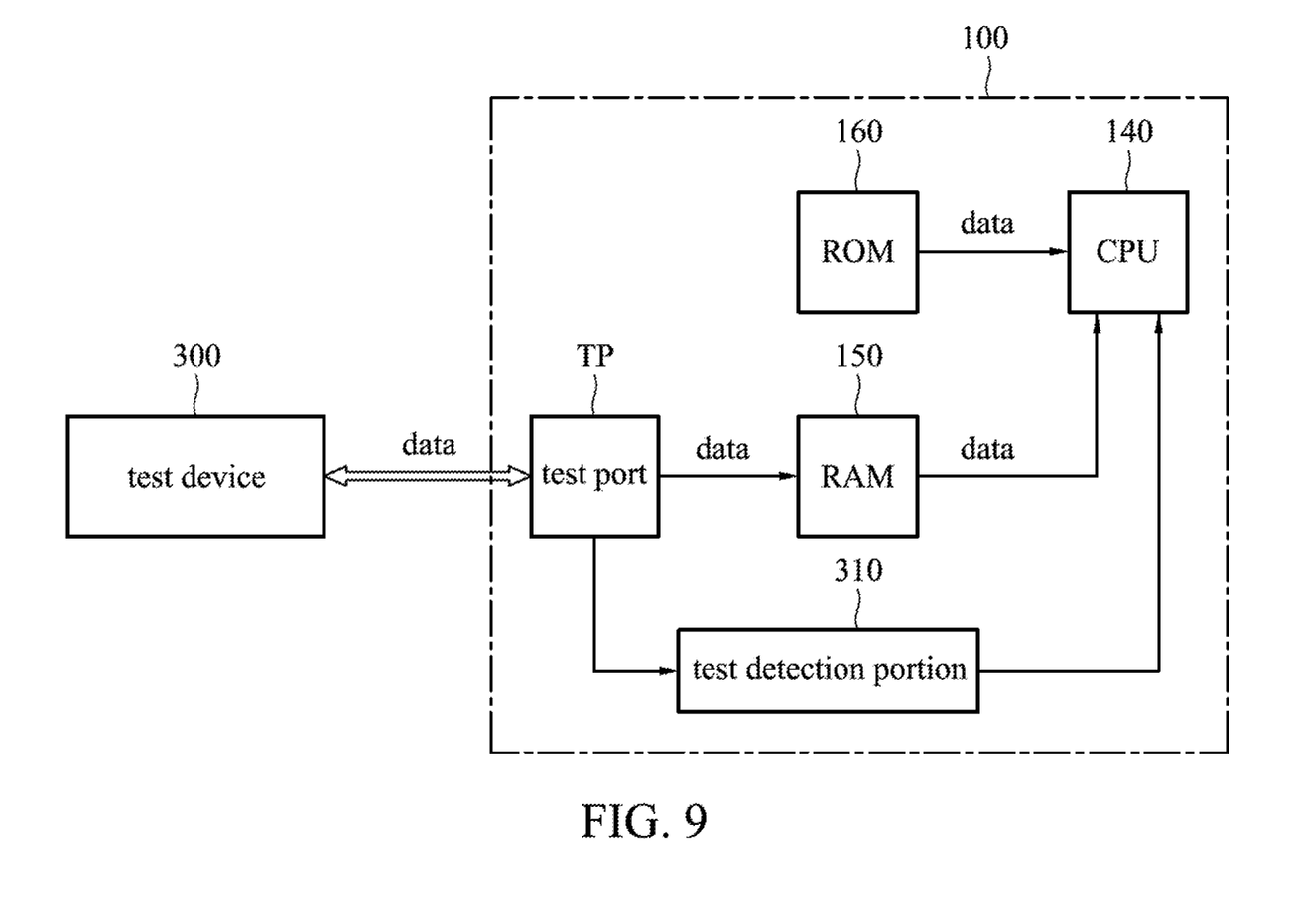
FIG. 9 a schematic view showing a method of writing optional data to a RAM during a test operation according to an exemplary embodiment.

Before an evaluation test is performed on the flash memory of the present embodiment, the necessary data can be directly written to the RAM 150 from the outside. When the evaluation test is performed, as shown in FIG. 9, the flash memory 100 is electrically connected to a test device 300 via a test port TP. The evaluation test may be performed at either the wafer level or the chip level. The test port TP may be, for example, an external terminal for inputting/outputting data or a pad thereof or a test-dedicated terminal or a pad thereof.

In a preferred embodiment, the test device 300 outputs a test start signal to the test port TP. A test detection portion 310 detects the test start signal applied to the test port TP and provides the detected signal to the CPU 140. When the CPU 140 receives the detected signal, the CPU 140 executes the test program stored in the ROM 160 and starts the test operation. Alternatively, in another preferred embodiment, the flash memory includes a built-in self-test (BIST) circuit in addition to the CPU 140, and the BIST circuit performs the test operation in response to the detected signal of the test detection portion 310.

At the beginning of the test operation, the CPU 140 builds a data channel between the test port TP (or the input/output buffer 120) and the RAM 150, and the data provided from the test device 300 to the test port TP can be written into a predetermined storage area of the RAM 150. The data written to the RAM 150 refers to the data related to the operating conditions of the flash memory, in other words, the data written to the RAM 150 refers to the data equivalent to the optional data stored in the optional-data storage portion 210. The CPU 140 performs an erasing operation and a programming operation according to the test operation or an instruction of the test device 300. At this time, the optional data obtained from the test device 300 and stored in the RAM 150 is used to determine the operating conditions for the erasing and programming operations and performs the test operation.

When the preferred optional data is determined through the test device 300, the test device 300 will program the preferred optional data to the optional-data storage portion 210 of the flash memory 100. That is, the test device 300 outputs a programming instruction and an address for programming in the optional-data storage portion 210 (this address is the same as an address at which the preferred optional data is read according to the data for optional-data reading Read1 and Read2) to the flash memory 100. As a result, the preferred optional data is programmed to the optional-data storage portion 210.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor memory device comprising:
a memory cell array including an optional-data storage portion, the optional-data storage portion storing first optional data including a plurality of option conditions to be selected for executing an erasing operation or a programming operation on the memory cell array;
a read only memory (ROM) storing second optional data including a read bias for executing a read operation on the memory cell and further storing a read command used to read a selected one of the plurality of option conditions from the memory cell array;
a central processing unit controlling the read operation of the memory cell array according to the second optional data read from the ROM; and
a random access memory (RAM),
wherein the central processing unit, in response to receiving an erasing instruction or a programming instruction, reads the second optional data and the read command from the ROM, reads the selected one of the plurality of option conditions from the memory cell array according to the read command read from the ROM, and then temporarily stores the read selected one of the plurality of option conditions in the RAM, and the central processing unit further reads selected one of the plurality of option conditions from the RAM for executing the erasing operation or the programming operation on the memory cell array.

2. The semiconductor memory device according to claim 1, wherein the plurality of option conditions includes voltages which are applied to the memory cell array during at least one of the programming operation and the erasing operation.

3. The semiconductor memory device according to claim 2, wherein the voltages which are applied to the memory cell array during the programming operation include a plurality of programming biases and a plurality of programming verification voltages.

4. The semiconductor memory device according to claim 3, wherein the central processing unit selects one of the plurality of programming biases and selects one of the plurality of programming verification voltages according to the second optional data.

5. The semiconductor memory device according to claim 2, wherein the voltages which are applied to the memory cell array during the erasing operation include a plurality of erasing biases and a plurality of erasing verification voltages.

6. The semiconductor memory device according to claim 5, wherein the central processing unit selects one of the plurality of erasing biases and selects one of the plurality of erasing verification voltages according to the second optional data.

7. The semiconductor memory device according to claim 1, wherein the memory cell array comprises a plurality of NAND strings.

8. The semiconductor memory device according to claim 1, wherein the ROM further stores an address for reading the selected one of the plurality of the option conditions from the memory cell array, and
wherein in response to receiving the erasing instruction or the programming instruction, the central processing unit reads the read command and the address from the ROM, and further reads the selected one of the plurality of the option conditions from the memory cell array according to the read command and the address read from the ROM and then temporarily stores the selected one of the plurality of the option conditions in the RAM.

9. The semiconductor memory device according to claim 1, further comprising:

an external terminal transmitting and receiving data between the semiconductor memory device and the outside, wherein during a test operation, the external terminal receives the first optional data, and the central processing unit receives the first optional data provided from the external terminal, and writes the received first optional data to the RAM.

10. The semiconductor memory device according to claim 1, wherein the first optional data is determined during an evaluation test operation and written in the memory cell array from the outside of the semiconductor memory device, and the second optional data further includes high voltage setting value and high voltage resetting value for the controlling a charge pump circuit.

11. The semiconductor memory device according to claim 10, wherein the ROM is a photomask ROM.

12. An operation setting method for a semiconductor memory device, the semiconductor memory device comprising a memory cell array, a random access memory (RAM), a read only memory (ROM), and a central processing unit, the operation setting method comprising:

storing first optional data including a plurality of option conditions to be selected for executing an erasing operation or a programming operation in the memory cell array;

storing second optional data including a read bias for executing a read operation on the memory cell array and storing a read command in the ROM, wherein the read command is used to read a selected one of the plurality of option conditions from the memory cell array;

controlling the read operation of the memory cell array according to the second optional data read from the ROM;

in response to receiving an erasing instruction or a programming instruction, reading the second optional data and the read command from the ROM, reading the selected one of the plurality of option conditions from the memory cell array according to the read command read from the ROM, and temporarily storing the read selected one of the plurality of option conditions in the RAM; and reading the selected one of the plurality of option conditions from the RAM for executing the erasing operation or the programming operation on the memory cell array.

13. The operation setting method according to claim 12, further comprising:

performing a test operation on the semiconductor memory device before shipping, wherein a result of the test operation determines the first optional data.

14. The operation setting method according to claim 13, further comprising:

receiving the first optional data from an external terminal and writing the first optional data to the RAM, wherein in the step of performing the test operation on the semiconductor memory device before shipping, the test operation is performed according to the first optional data which is written to the RAM.

15. The operation setting method according to claim 12, further comprising:

storing an address in the ROM, wherein the address stored in the ROM is used for reading the selected one of the plurality of option conditions from the memory cell array; and in response to receiving the erasing instruction or the programming instruction, reading the read command and the address from the ROM, wherein the selected one of the plurality of option conditions is stored in the memory cell array according to the address, and the selected one of the plurality of option conditions is read from the memory cell array according to the read command and the address read from the ROM.

* * * * *